(12) United States Patent
    Ami (10) Patent No.: US 10,121,773 B2
(45) Date of Patent: Nov. 6, 2018

(54) SEMICONDUCTOR APPARATUS (71) Applicant: FUJI ELECTRIC CO., LTD., Kanagawa (JP)

(72) Inventor: Hideo Ami, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/446,012

(22) Filed: Mar. 1, 2017

(65) Prior Publication Data
    US 2017/0179095 A1    Jun. 22, 2017

Related U.S. Application Data

(63) Continuation of application No. PCT/JP2016/053236, filed on Feb. 3, 2016.

(30) Foreign Application Priority Data

Mar. 5, 2015 (JP) .................................. 2015-043316

(51) Int. Cl.
    *H01L 29/40*    (2006.01)
    *H01L 25/18*    (2006.01)
    *H01L 23/538*   (2006.01)
    *H02M 3/158*    (2006.01)
    *H01L 23/00*    (2006.01)

(52) U.S. Cl.
    CPC .......... *H01L 25/18* (2013.01); *H01L 23/5386* (2013.01); *H02M 3/158* (2013.01);
    (Continued)

(58) Field of Classification Search
    CPC ....... H01L 2224/48227; H01L 23/5386; H01L 24/48; H01L 2924/01013;
    (Continued)

(56) References Cited

U.S. PATENT DOCUMENTS

| 5,761,040 | A  | 6/1998 | Iwasa et al. |
| 6,353,258 | B1 | 3/2002 | Inoue et al. |
| 2007/0051974 | A1* | 3/2007 | Azuma ................... H01L 24/40 257/177 |

(Continued)

FOREIGN PATENT DOCUMENTS

| CN | 201478300 U | 5/2010 |
| JP | H08-195471 A | 7/1996 |
| JP | 2002-353407 A | 12/2002 |

OTHER PUBLICATIONS

Office Action issued for counterpart Japanese Application 2017-503381, issued by the Japan Patent Office dated Nov. 7, 2017.

(Continued)

*Primary Examiner* — Long K Tran (57) ABSTRACT

A semiconductor apparatus reduces the effect of inductances and induced magnetic fields, and causes a large current to flow from one device to another device. Provided is a semiconductor apparatus comprising a first device of a first region; a second device of a second region; and a connection conductor that electrically connects the first device to the second device. The connection conductor includes current paths that are adjacent and have opposite directions in at least a portion thereof. The connection conductor causes current to flow from the first device to the second device, and causes current to flow in a direction from the second device toward the first device in at least a portion thereof.

14 Claims, 11 Drawing Sheets

(52) U.S. Cl.
CPC .... *H01L 24/48* (2013.01); *H01L 2224/48227* (2013.01); *H01L 2924/01013* (2013.01); *H01L 2924/01029* (2013.01); *H01L 2924/1203* (2013.01); *H01L 2924/13055* (2013.01); *H01L 2924/13091* (2013.01)

(58) Field of Classification Search
CPC ... H01L 2924/01029; H01L 2924/1203; H01L 2924/13055; H01L 2924/13091; H02M 3/158
USPC .......................................................... 257/773
See application file for complete search history.

(56) References Cited

U.S. PATENT DOCUMENTS

| | | | |
|---|---|---|---|
| 2007/0228413 A1 | 10/2007 | Bayerer et al. | |
| 2014/0233204 A1* | 8/2014 | Tokuyama | H02M 7/003 361/820 |
| 2015/0060940 A1* | 3/2015 | Muto | H01L 23/49562 257/140 |

OTHER PUBLICATIONS

International Search Report for International Patent Application No. PCT/JP2016/053236, issued by the Japan Patent Office dated Apr. 19, 2016.

Office Action issued for counterpart Chinese Application 201680002449.9, issued by the Chinese Intellectual Property Office dated Aug. 28, 2018.

* cited by examiner

SEMICONDUCTOR APPARATUS

The contents of the following Japanese patent applications are incorporated herein by reference:
 NO. 2015-043316 filed on Mar. 5, 2015, and
 NO. PCT/JP2016/053236 filed on Feb. 3, 2016.

BACKGROUND

1. Technical Field

The present invention relates to a semiconductor apparatus.

2. Related Art

Conventionally, a power semiconductor module, which is a semiconductor apparatus that handles a large amount of power, as an example, has a wiring electrode that causes current to flow in one direction and another wiring electrode that causes current to flow in a direction opposite the one direction, and these electrodes are brought into close contact with each other in parallel such that the inductances and the induced magnetic fields generated by these wiring electrodes cancel out, such as shown in Patent Documents 1 and 2, for example.

Patent Document 1: Japanese Patent Application Publication No. H9-172139
Patent Document 2: Japanese Patent Application Publication No. 2002-353407

However, there are cases where there are no current paths that can be arranged in a manner to cancel out the inductances and the induced magnetic fields, due to the circuit structure included in the power semiconductor module. For example, in a case where there is only a current path simply supplying current from one device to another device, since there is no current path causing an approximately equivalent current to flow in the opposite direction, the inductances and the induced magnetic fields affect the internal or external devices.

SUMMARY

Therefore, it is an object of an aspect of the innovations herein to provide a semiconductor apparatus, which is capable of overcoming the above drawbacks accompanying the related art. The above and other objects can be achieved by combinations described in the claims. According to a first aspect of the present invention, provided is a semiconductor apparatus comprising a first device of a first region; a second device of a second region; and a connection conductor that electrically connects the first device to the second device. The connection conductor includes current paths that have opposite directions in at least a portion thereof.

(Item 1)

A semiconductor apparatus may comprise one or more first devices of a first region.

The semiconductor apparatus may comprise one or more second devices of a second region.

The semiconductor apparatus may comprise a connection conductor that electrically connects the first device to the second device.

The connection conductor may include current paths that are adjacent and have opposite directions in at least a portion thereof.

(Item 2)

The connection conductor may cause current to flow from the first device to the second device.

The connection conductor may cause current to flow in a direction from the second device toward the first device in at least a portion thereof.

(Item 3)

The connection conductor may cause current to flow from the second device to the first device.

The connection conductor may cause current to flow in a direction from the first device to the second device in at least a portion thereof.

(Item 4)

The connection conductor may include a first current path with a direction away from the second device on a first device side.

The connection conductor may include a second current path that folds back from the first current path to have a direction toward the second device.

(Item 5)

The connection conductor may include a third current path with a direction away from the first device on a second device side.

The connection conductor may include a fourth current path that folds back from the third current path to have a direction toward the first device.

(Item 6)

The connection conductor may have a parallel board structure formed by the current paths that are adjacent to each other.

(Item 7)

The semiconductor apparatus may comprise a plurality of the first devices in the first region.

The connection conductor may be connected in parallel with each of the plurality of first devices.

(Item 8)

The semiconductor apparatus may comprise a plurality of the second devices in the second region.

The connection conductor may be connected in parallel with each of the plurality of second devices.

(Item 9)

The connection conductor may include a main conducting portion having the first current path, the second current path, the third current path, and the fourth current path.

The connection conductor may include a plurality of first connecting portions that connect the first current path respectively to the plurality of first devices.

The connection conductor may include a plurality of second connecting portions that connect the third current path respectively to the plurality of second devices.

(Item 10)

The semiconductor apparatus may comprise a plurality of the first devices in the first region.

The semiconductor apparatus may comprise a plurality of the second devices in the second region.

The plurality of first devices and the plurality of second devices may be arranged in a direction from the first region toward the second region.

(Item 11)

The connection conductor may further include a terminal portion that is connected to outside and transfers current to and from the outside.

(Item 12)

The semiconductor apparatus may further comprise a substrate.

The semiconductor apparatus may have the first region and the second region provided in the substrate.

(Item 13)

The substrate may be an insulated substrate.

(Item 14)

The first devices and the second device may be insulated gate bipolar transistors or power MOSFETs.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
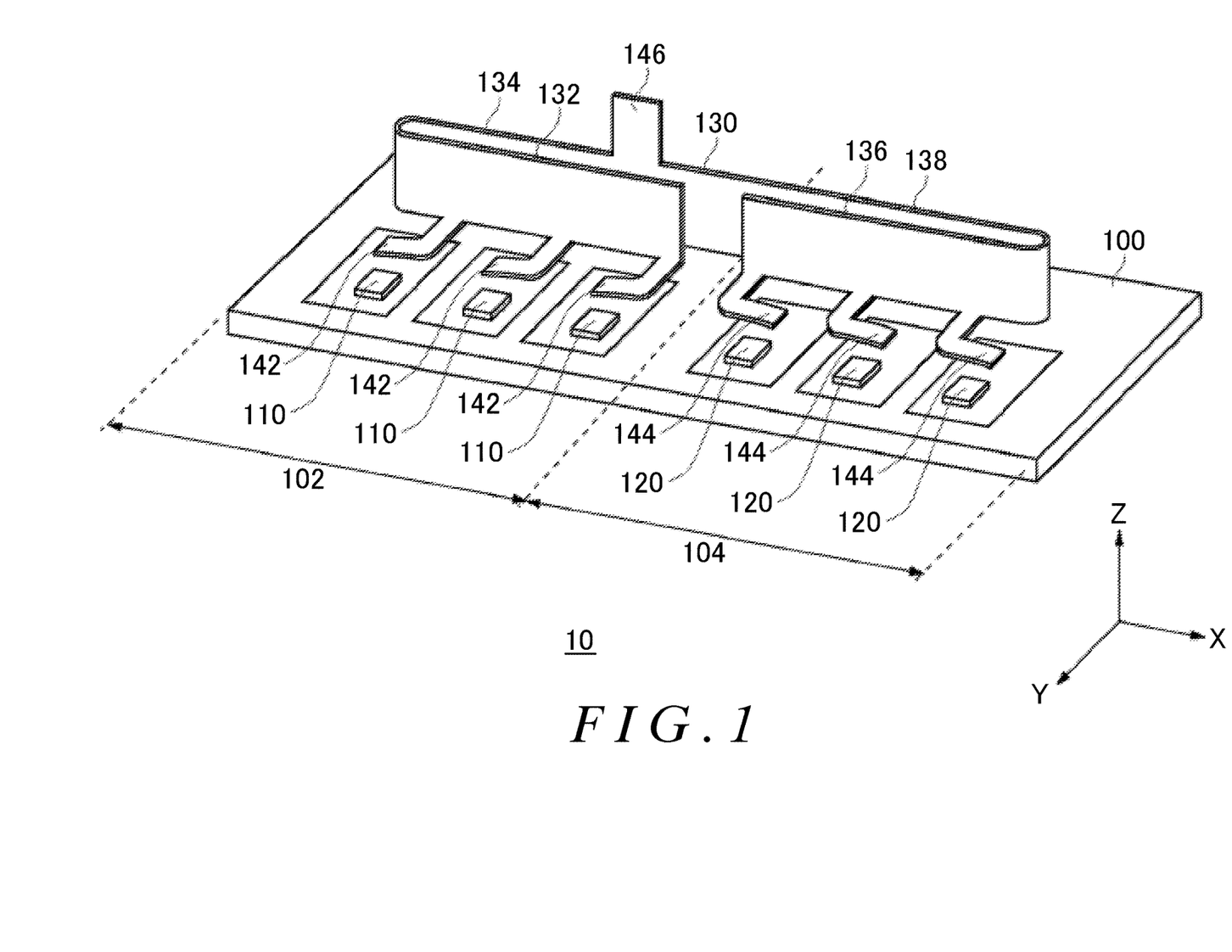
FIG. 1 shows an exemplary configuration of a semiconductor apparatus 10 according to the present embodiment.

FIG. 1 shows an exemplary configuration of a semiconductor apparatus 10 according to the present embodiment. The semiconductor apparatus 10 causes current to flow in a manner to reduce the effect of the inductances and the induced magnetic fields when this current is transferred among a plurality of devices mounted on this semiconductor apparatus 10. In this way, the effects of this current outside or inside these devices is reduced. In other words, the surge voltage generated by the change in this current due to switching of the devices is reduced. The semiconductor apparatus 10 includes a first device 110, a second device 120, and a connection conductor 130. Furthermore, the semiconductor apparatus 10 includes a substrate 100.

The substrate 100 has devices, a circuit board connecting to these devices, and the like mounted thereon. The substrate 100 is preferably a one-side mounting substrate on which devices are mounted on only one side. The substrate 100 is preferably an insulated substrate such as a DCB (Direct Copper Bonding) substrate or an AMB (Active Metal Blazed) substrate. Here, an example is described in which the substrate 100 according to the present embodiment includes a first region 102 and a second region 104 that is adjacent to the first region 102. In FIG. 1, the first region 102 and the second region 104 are shown as regions lined up in the X-axis direction in one surface of the substrate 100.

One or more first devices 110 are mounted on the first region 102. A plurality of the first devices 110 may be mounted on the first region 102. Furthermore, as an example, the first devices 110 may be arranged along a direction form the first region 102 toward the second region 104.

One or more second devices 120 are mounted on the second region 104. A plurality of the second devices 120 may be mounted on the second region 104. Furthermore, as an example, the second devices 120 may be arranged along a direction form the first region 102 toward the second region 104. FIG. 1 shows an example in which three of the first devices 110 and three of the second devices 120 are arranged in the X-axis direction.

As an example, the first devices 110 and the second devices 120 are power semiconductor elements used to control a power device or the like, and are power control devices such as diodes, transistors, thyristors, or triacs. The first devices and the second devices are reverse-blocking insulated gate bipolar transistors (RB-IGBTs), for example. Furthermore, the first devices 110 and the second devices 120 may be circuits having a plurality of these power control devices connected thereto.

The connection conductor 130 electrically connects the first devices 110 and the second devices 120. The connection conductor 130 causes current to flow from the first devices 110 to the second devices 120 or from the second devices 120 to the first devices 110, according to a voltage difference between the first devices 110 and the second devices 120.

The connection conductor 130 includes a plurality of current paths, and current paths having opposite directions from each other are included adjacent to each other in at least a portion of the connection conductor 130. The connection conductor 130 is preferably formed of metal with high electrical conductivity, such as copper or aluminum, and is preferably formed integrally. The connection conductor 130 includes a first current path 132, a second current path 134, a third current path 136, a fourth current path 138, a first connecting portion 142, a second connecting portion 144, and a terminal portion 146.

The first current path 132 is on the first device 110 side and extends in a direction away from the second device 120 side. In other words, the first current path 132 is on the first region 102 side and extends in a direction away from the second region 104, e.g. the −X-axis direction. The first current path 132 is connected to the second current path 134.

The second current path 134 is on the first region 102 side, and folds back from the first current path 132 to extend in a direction toward the second device 120. In other words, the second current path 134 folds back from the first current path 132 to become adjacent to the first current path 132, and extends from the first region 102 to the second region 104, e.g. in the +X-axis direction.

The third current path 136 is on the second device 120 side and extends in a direction away from the first device 110. In other words, the third current path 136 is on the second region 104 side and extends in a direction away from the first region 102, e.g. the +X-axis direction. The third current path 136 is connected to the fourth current path 138.

The fourth current path 138 is on the second region 104 side, and folds back from the third current path 136 to extend in a direction toward the first device 110. In other words, the fourth current path 138 folds back from the third current path 136 to become adjacent to the third current path 136, and extends from the second region 104 to the first region 102, e.g. in the −X-axis direction, and connects to the second current path 134. In other words, when viewed from the second current path 134 side the fourth current path 138 continues from the second current path 134 to extend in a direction away from the first region 102. Furthermore, the third current path 136 folds back from the fourth current path 138 to become adjacent to the fourth current path 138 and draws near the first region 102.

In other words, the first current path 132 is not directly electrically connected to the third current path 136, and is instead connected to the third current path 136 via the second current path 134 and the fourth current path 138. In this way, the connection conductor 130 has a main conducting portion formed by a plurality of current paths that are continuous in the order of the first current path 132, the second current path 134, the fourth current path 138, and the third current path 136. In the semiconductor apparatus 10, current is caused to flow between the first device 110 and the second device 120 by using this main conducting portion. A connection is made between the main conducting portion and the first device 110 by the first connecting portion 142, and a connection is made between the main conducting portion and the second device 120 by the second connecting portion 144.

The first connecting portion 142 makes a connection between the first current path 132 and the first device 110. In a case where a plurality of the first devices 110 are mounted on the substrate 100, a plurality of the first connecting portions 142 are provided in the connection conductor 130. A plurality of connections between the first current path 132 and the plurality of first devices 110 are made respectively by the plurality of first connecting portions 142. As an example, the first connecting portion 142 is connected to a circuit board or the like formed by copper or the like on one surface of the substrate 100, and is electrically connected to the first device 110 via this circuit board. In a case where a plurality of the first devices 110 are provided on the first region 102, the connection conductor 130 is electrically connected to each of the plurality of first devices 110 by the first connecting portions 142, and branches or combines the current flowing therethrough.

The second connecting portion 144 is connected between the third current path 136 and the second device 120. In a case where a plurality of the second devices 120 are mounted on the substrate 100, a plurality of the second connecting portions 144 are provided in the connection conductor 130. A plurality of connections between the third current path 136 and the plurality of second devices 120 are made respectively by the plurality of second connecting portions 144. As an example, the second connecting portion 144 is connected to a circuit board or the like formed by copper or the like on one surface of the substrate 100, and is electrically connected to the second device 120 via this circuit board. In a case where a plurality of the second devices 120 are provided on the second region 104, the connection conductor 130 is electrically connected to each of the plurality of second devices 120 by the second connecting portions 144, and branches or combines the current flowing therethrough.

The terminal portion 146 is connected to the outside and transfers current to and from the outside. In a case where the terminal portion 146 causes current (voltage) to be transferred between the outside of the semiconductor apparatus 10 and the first device 110 and/or second device 120, the terminal portion 146 functions as an input terminal and/or output terminal.

The connection conductor 130 described above causes current to flow from the first device 110 to the second device 120 or from the second device 120 to the first device 110, via the folded-back current path. For example, when the voltage of the first device 110 is higher than the voltage of the second device 120, the connection conductor 130 causes current to flow from the first device 110 to the second device 120. In this case, the connection conductor 130 causes current to flow in at least a portion of the connection conductor 130 in a direction from the second device 120 toward the first device 110. In the present embodiment, the connection conductor 130 causes current to flow in the first current path 132 in a direction (−X direction) from the second device 120 toward the first device 110.

Furthermore, when the voltage of the second device 120 is higher than the voltage of the first device 110, the connection conductor 130 causes current to flow from the second device 120 to the first device 110. In this case, the connection conductor 130 causes current to flow in at least a portion thereof in a direction from the first device 110 toward the second device 120. In the present embodiment, the connection conductor 130 causes current to flow in the third current path 136 in a direction (+X direction) from the first device 110 toward the second device 120. The connection conductor 130 forms a parallel board structure in which adjacent current paths are parallel to each other, and reduces the inductances and the induced magnetic fields generated in these current paths. The operation by which the connection conductor 130 reduces the inductances and the induced magnetic fields is described using FIG. 2.

Figure 2:
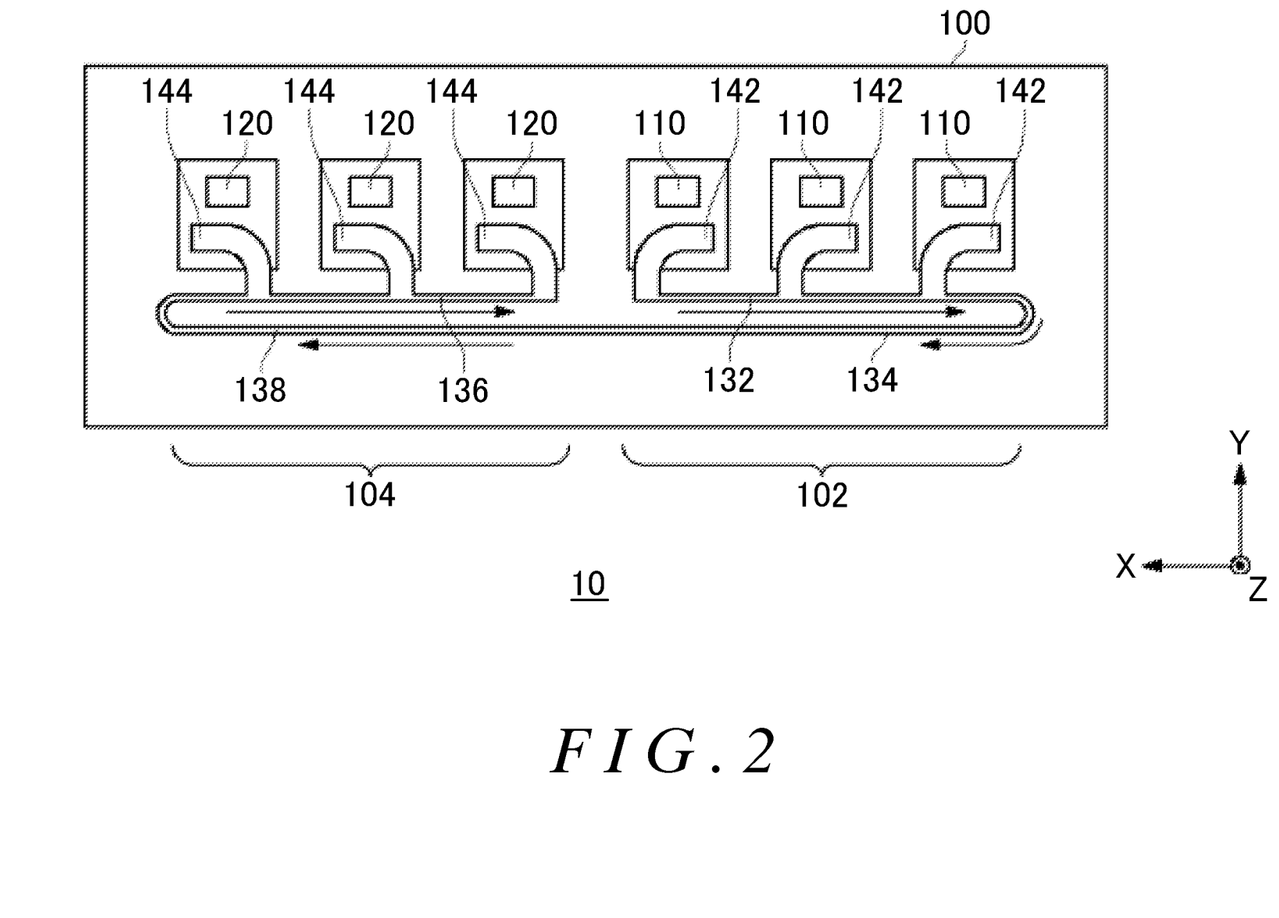
FIG. 2 is an exemplary overhead view of a semiconductor apparatus 10 according to the present embodiment.

FIG. 2 is an exemplary overhead view of a semiconductor apparatus 10 according to the present embodiment. FIG. 2 shows an example in which the connection conductor 130 of the semiconductor apparatus 10 described in FIG. 1 causes current to flow from the first device 110 to the second device 120. Specifically, FIG. 2 is used to describe an example in which a plurality of the first devices 110 have a higher potential than a plurality of the second devices 120, and current is provided to the second devices 120.

A plurality of the first connecting portions 142 transmit the current supplied respectively from the plurality of first devices 110 to the first current path 132 to combine these currents. The first current path 132 causes the current supplied respectively from the plurality of first devices 110 lined up in the X-axis direction to be combined while flowing in a direction (−X-axis direction) away from the second devices 120. The first current path 132 is connected to the second current path 134, and the second current path 134 causes current from the first current path 132 to be folded back and flow in a direction (+X-axis direction) toward the second devices 120.

Here, the first current path 132 and the second current path 134 are adjacent to each other, and form a parallel board structure in at least a portion thereof In other words, in the parallel boards, the currents flow in directions opposite each other, and therefore the inductances and the induced magnetic fields generated respectively due to the currents flowing through the first current path 132 and the second current path 134 have opposite directions from each other and cancel out. Accordingly, by having the first current path 132 and the second current path 134 adjacent to each other, it is possible to reduce the inductances and the induced magnetic fields generated respectively due to the currents flowing through the first current path 132 and the second current path 134.

The second current path 134 is connected to the fourth current path 138, and the fourth current path 138 causes current from the second current path 134 to flow, on the second region 104 side, in a direction (+X-axis direction) away from the first devices 110. The fourth current path 138 is connected to the third current path 136, and the third current path 136 causes the current from the fourth current path 138 to fold back and flow in a direction (−X-axis direction) toward the first devices 110.

Here, the third current path 136 and the fourth current path 138 are adjacent to each other, and form a parallel board structure in at least a portion thereof In other words, in the parallel boards, the currents flow in directions opposite each other, and therefore the inductances and the induced magnetic fields generated respectively due to the currents flowing through the third current path 136 and the fourth current path 138 have opposite directions from each other and cancel out. Accordingly, by having the third current path 136 and the fourth current path 138 adjacent to each other, it is possible to reduce the inductances and the induced magnetic fields generated respectively due to the currents flowing through the third current path 136 and the fourth current path 138.

The plurality of second connecting portions 144 each branch the current flowing through the third current path 136 and supply these branched currents respectively to the second devices 120. In other words, the third current path 136 causes the currents supplied respectively from the plurality of first devices 110 lined up in the X-axis direction to flow in a direction (+X-axis direction) toward the first devices 110 on the second region 104 side, while branching these currents to the plurality of second devices 120 lined up in the X-axis direction.

Therefore, the connection conductor 130 according to the present embodiment can cause the current to flow from the plurality of first devices 110 to the plurality of second devices 120 while reducing the effect of the inductances and the induced magnetic fields. In this way, by adjacently positioning current paths that fold back the current flowing therethrough to realize currents in the opposite direction in the connection conductor 130, the generation of the inductances and the induced magnetic fields is reduced. Accordingly, the connection conductor 130 can reduce the generation of the inductances and the induced magnetic fields without needing another connection conductor, another current path, or the like. Therefore, even when a current path is provided that supplies current from one device to another device, the connection conductor 130 can reduce the effects of the inductances and the induced magnetic fields on the external or internal devices.

In this way, the connection conductor 130 according to the present embodiment reduces the effect on the external or internal devices, and can therefore be wired without considering the relationship with other current paths. Therefore, with the connection conductor 130, it is possible to increase the degree of freedom for the wiring design for high power transceiving, a control circuit, or the like. Furthermore, since the connection conductor 130 reduces the effect on internal devices, it is possible to arrange a device or the like (e.g. the first device 110 or the second device 120) near this connection conductor 130. Therefore, it is possible to reduce the implementation area of the semiconductor apparatus 10.

Figure 3:
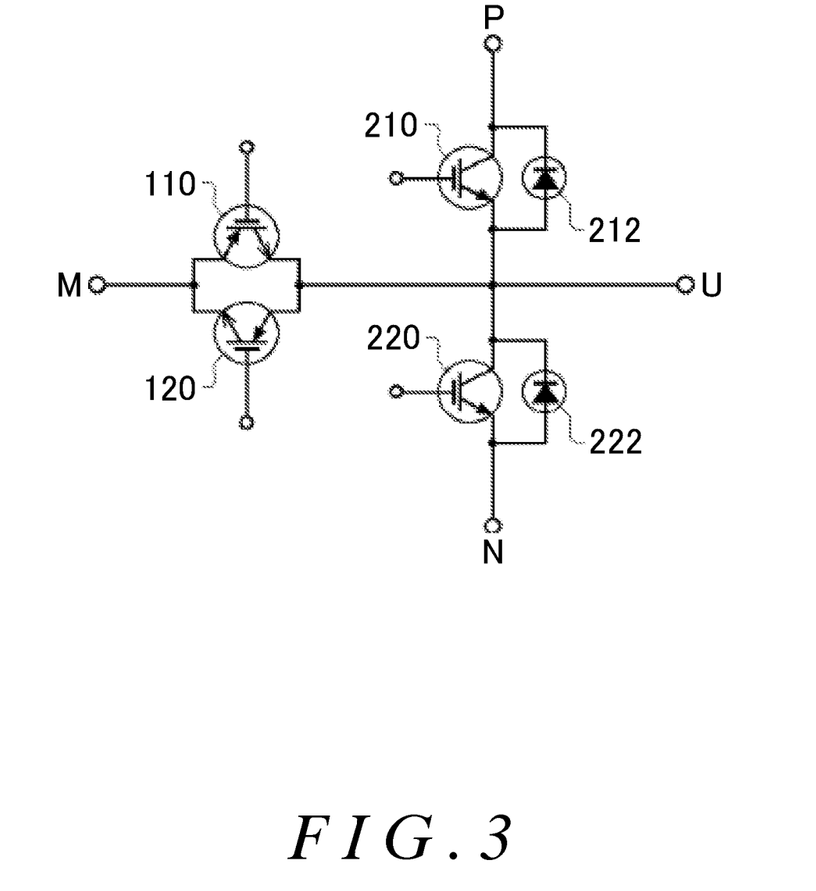
FIG. 3 shows an exemplary circuit mounted on the semiconductor apparatus 10 according to the present embodiment.

FIG. 3 shows an exemplary circuit mounted on the semiconductor apparatus 10 according to the present embodiment. FIG. 3 shows an example of a semiconductor apparatus that switches the supply of power among a predetermined plurality of types. The semiconductor apparatus includes a first device 110 and a second device 120 connected in reverse parallel between a terminal M and a terminal U. Furthermore, the semiconductor apparatus includes a third device 210 and a fourth device 220 connected in series between a terminal P and a terminal N. Yet further, the semiconductor apparatus includes a fifth device 212 and a sixth device 222 connected in series between the terminal P and the terminal N.

The collector terminal of the first device 110 is connected to the terminal M, and the emitter terminal of the first device 110 is connected to the terminal U. In other words, the first device 110 functions as a switching device that switches whether current flows from the terminal M to the terminal U, according to a control signal supplied to the base terminal. Furthermore, the collector terminal of the second device 120 is connected to the terminal U and the emitter terminal of the second device 120 is connected to the terminal M. In other words, the second device 120 functions as a switching device that switches whether current flows from the terminal U to the terminal M, according to a control signal supplied to the base terminal.

The collector terminal of the third device 210 is connected to the terminal P, and the emitter terminal of the third device 210 is connected to the terminal U. In other words, the third device 210 functions as a switching device that switches whether current flows from the terminal P to the terminal U, according to a control signal supplied to the base terminal. The collector terminal of the fourth device 220 is connected to the terminal U, and the emitter terminal of the fourth device 220 is connected to the terminal N. In other words, the fourth device 220 functions as a switching device that switches whether current flows from the terminal U to the terminal N, according to a control signal supplied to the base terminal.

The fifth device 212 is a diode that has the anode terminal, which is one terminal thereof, connected to the terminal U and the cathode terminal, which is another terminal thereof, connected to the terminal P, and causes current to flow in one direction from the terminal U to the terminal P. In other words, the fifth device 212 is connected in reverse parallel with the third device 210 between the terminal P and the terminal U. The sixth device 222 is a diode that has the anode terminal, which is one terminal thereof, connected to the terminal N and the cathode terminal, which is another terminal thereof, connected to the terminal U, and causes current to flow in one direction from the terminal N to the terminal U. In other words, the sixth device 222 is connected in reverse parallel with the fourth device 220 between the terminal U and the terminal N.

Figure 4:
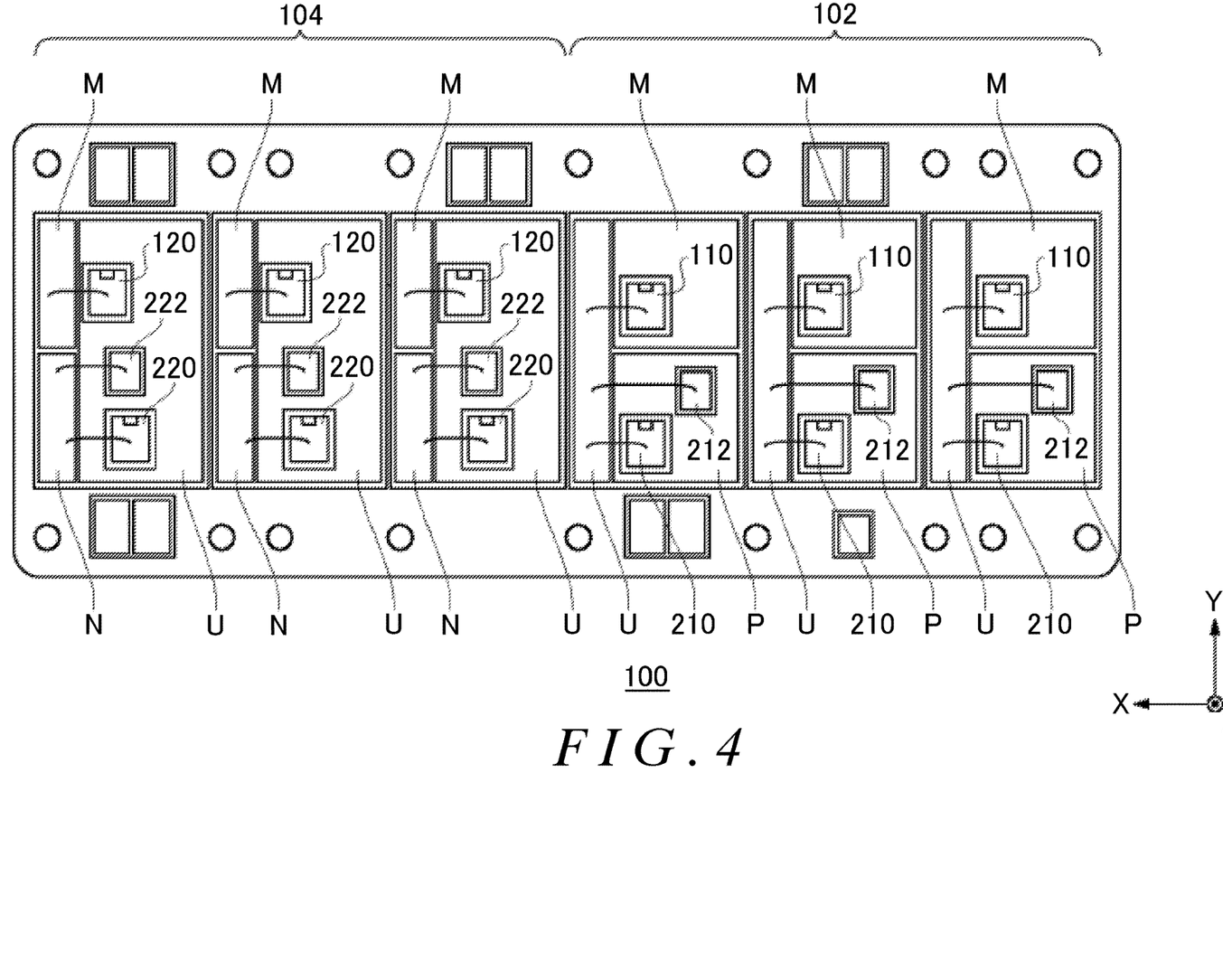
FIG. 4 shows an example of a substrate 100 according to the present embodiment.
Figure 5:
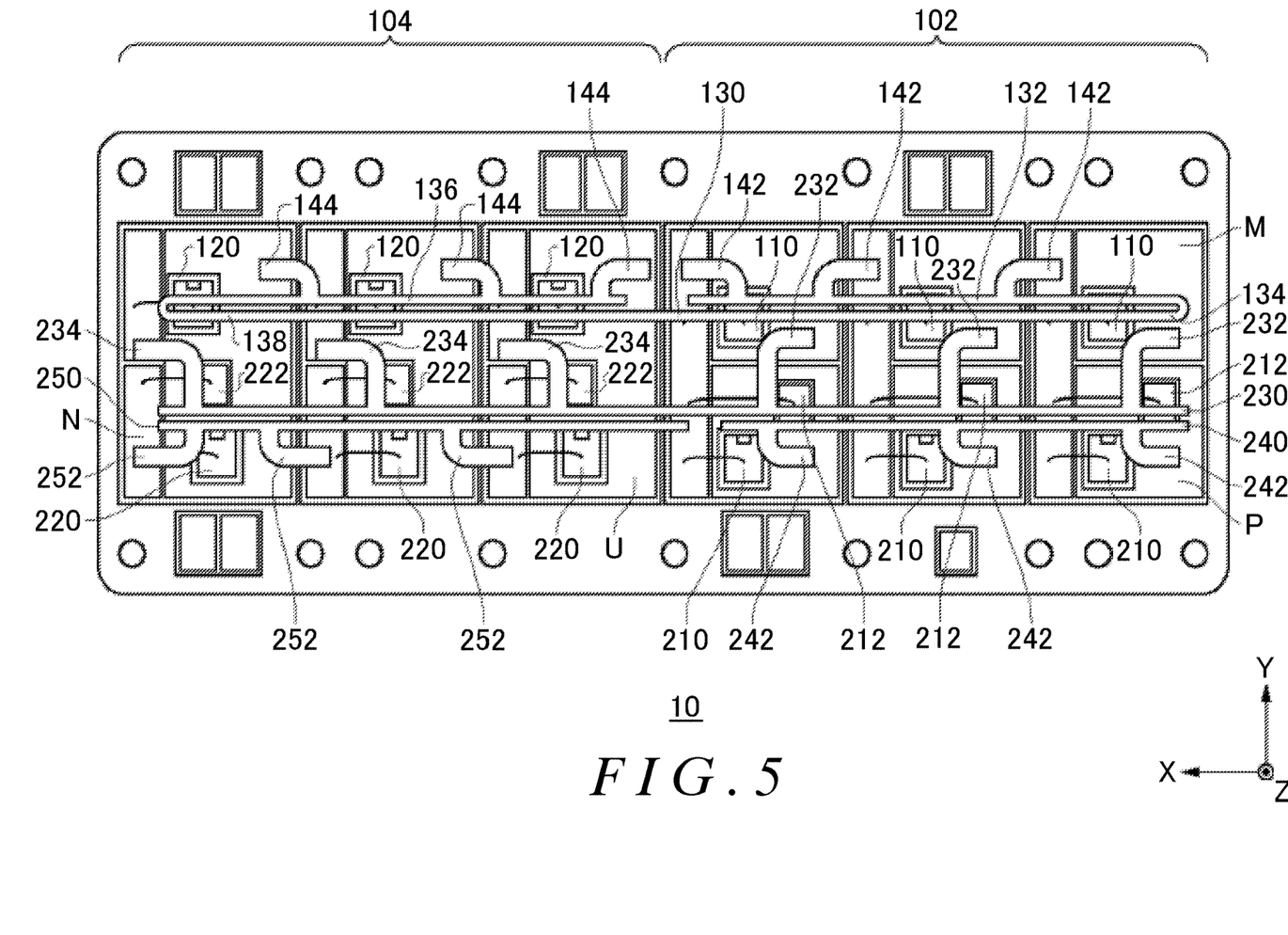
FIG. 5 shows an example of a semiconductor apparatus 10 according to the present embodiment.

FIGS. 4 and 5 are used to describe an example in which the semiconductor apparatus described above is formed as the semiconductor apparatus 10 described in FIGS. 1 and 2. FIG. 4 shows an example of a substrate 100 according to the present embodiment. The substrate 100 has the connection conductor 130 connected thereto, thereby forming the semiconductor apparatus 10. In other words, the substrate 100 shown in FIG. 4 is in a state before the connection conductor 130 is mounted. Furthermore, the substrate 100 shown in FIG. 4 is in a state where the devices, the circuit board, and the like have already been formed.

A circuit board corresponding to the terminal P, the terminal N, the terminal M, and the terminal U is formed on the substrate 100, for example. The plurality of terminals indicated by the same reference numerals or characters are each electrically connected by wire bonding or the like.

The first device 110 is provided on the first region 102 and is connected to each of the terminal M and the terminal U. The second device 120 is provided on the second region 104 and is connected to each of the terminal M and the terminal U. The third device 210 and the fifth device 212 are provided on the first region 102 and are connected to each of the terminal P and the terminal U. The fourth device 220 and the sixth device 222 are provided on the second region 104 and are connected to each of the terminal U and the terminal N. FIG. 4 shows an example in which three of each device are mounted on the substrate 100.

The terminals M, the terminals N, the terminals P, and the terminals U may be connected to a circuit board or the like provided on the substrate 100. In the same manner, each of the electrodes of the first devices 110, the second devices 120, the third devices 210, and the fourth devices 220 may be connected to the circuit board or the like provided on the substrate 100.

FIG. 5 shows an exemplary semiconductor apparatus 10 according to the present embodiment. FIG. 5 shows a state in which the connection conductor 130 according to the present embodiment has been mounted on the substrate 100 shown in FIG. 4. Furthermore, in FIG. 5, a connection conductor 230, a connection conductor 240, and a connection conductor 250 are further mounted.

The first connecting portion 142 of the connection conductor 130 is connected to the terminal U of the first region 102, and the second connecting portion 144 is connected to the terminal U of the second region 104. Furthermore, the terminal portion 146 functioning as the terminals U of the semiconductor apparatus 10 is connected to an external load, for example. Therefore, the emitter terminal of the first device 110 is connected to the collector terminal of the second device 120 via the connection conductor 130. Furthermore, the emitter terminal of the first device 110 and the collector terminal of the second device 120 are connected to the external load via the terminal portion 146.

The connection conductor 230 includes a third connecting portion 232 and a fourth connecting portion 234. The third connecting portion 232 is connected to the terminal M of the first region 102, and the fourth connecting portion 234 is connected to the terminal M of the second region 104. The connection conductor 230 further includes a terminal portion functioning as the terminals M of the semiconductor apparatus 10, for example, and this terminal portion is connected to an external power supply. Therefore, the collector terminal of the first device 110 is connected to the emitter terminal of the second device 120 via the connection conductor 230. Furthermore, the collector terminal of the first device 110 and the emitter terminal of the second device 120 is connected to the external power supply.

The connection conductor 240 includes a fifth connecting portion 242. The fifth connecting portion 242 is connected to the terminal P of the first region 102. Furthermore, the connection conductor 240 further includes a terminal portion functioning as the terminals P of the semiconductor apparatus 10, for example, and this terminal portion is connected to the external power supply. Therefore, the collector terminals of a plurality of the third devices 210 and the cathode terminals of the fifth devices 212 are connected to the external power supply via the connection conductor 240.

The connection conductor 250 includes a sixth connecting portion 252. The sixth connecting portion 252 is connected to the terminal N of the second region 104. Furthermore, the connection conductor 250 further includes a terminal portion functioning as the terminals N of the semiconductor apparatus 10, for example, and this terminal portion is connected to the external power supply or a reference potential. Therefore, the emitter terminals of a plurality of the fourth devices 220 and the anode terminals of the sixth devices 222 are connected to the external power supply of the reference potential via the connection conductor 250.

When current flows from the first devices 110 to the second devices 120, as described in FIGS. 1 and 2, the semiconductor apparatus 10 connected in the manner described above can cause current to flow from the plurality of first devices 110 to the plurality of second devices 120 while reducing the generation of the inductances and the induced magnetic fields using the connection conductor 130.

In the semiconductor apparatus 10, there are cases where current is input from the outside via the connection conductor 240 (i.e. from the terminal P) and current is output to the outside via the connection conductor 230 (i.e. from the terminal M). In this case, the connection conductor 230 has a parallel board structure with the connection conductor 240 in the first region 102, and therefore the currents flowing respectively through the connection conductor 230 and the connection conductor 240 have current paths that are in opposite directions. Therefore, in the semiconductor apparatus 10 it is possible to reduce the generation of the inductances and the induced magnetic fields.

Furthermore, in the semiconductor apparatus 10, there are also cases where current is input from the outside via the connection conductor 230 (i.e. from the terminal M) and current is output to the outside via the connection conductor 250 (i.e. the terminal N). In this case, the connection conductor 230 has a parallel board structure with the connection conductor 250 in the second region 104, and therefore the currents flowing respectively through the connection conductor 230 and the connection conductor 250 have current paths that are in opposite directions. Therefore, in the semiconductor apparatus 10 it is possible to reduce the generation of the inductances and the induced magnetic fields.

In the manner described above, in a case where there are two different current paths that are independent from each other and have current flowing respectively therethrough in opposite directions in the semiconductor apparatus 10, these two current paths are provided adjacent to each other in a manner to form a parallel board structure. Furthermore, in a case where there is only one independent current path and no corresponding current path in which current flows in the opposite direction in the semiconductor apparatus 10, this one current path includes a plurality of continuous current paths, and these current paths having opposite directions from each other are provided to be adjacent in at least a portion thereof. Therefore, the semiconductor apparatus 10 can reduce the inductances and the induced magnetic fields of the entire power semiconductor module generated according to the current flowing due to the power control. In other words, it is possible to reduce the surge voltage generated in the semiconductor module.

Furthermore by combining one or more of the semiconductor apparatuses 10 shown in FIG. 5, it is possible to form a power control circuit in which the inductances and the induced magnetic fields are reduced. In particular, by combining two or more semiconductor apparatuses 10, it is possible to form a more complex power control circuit. For example, by combining two semiconductor apparatuses 10, it is possible to form a power control circuit that outputs a plurality of signal levels.

Figure 6:
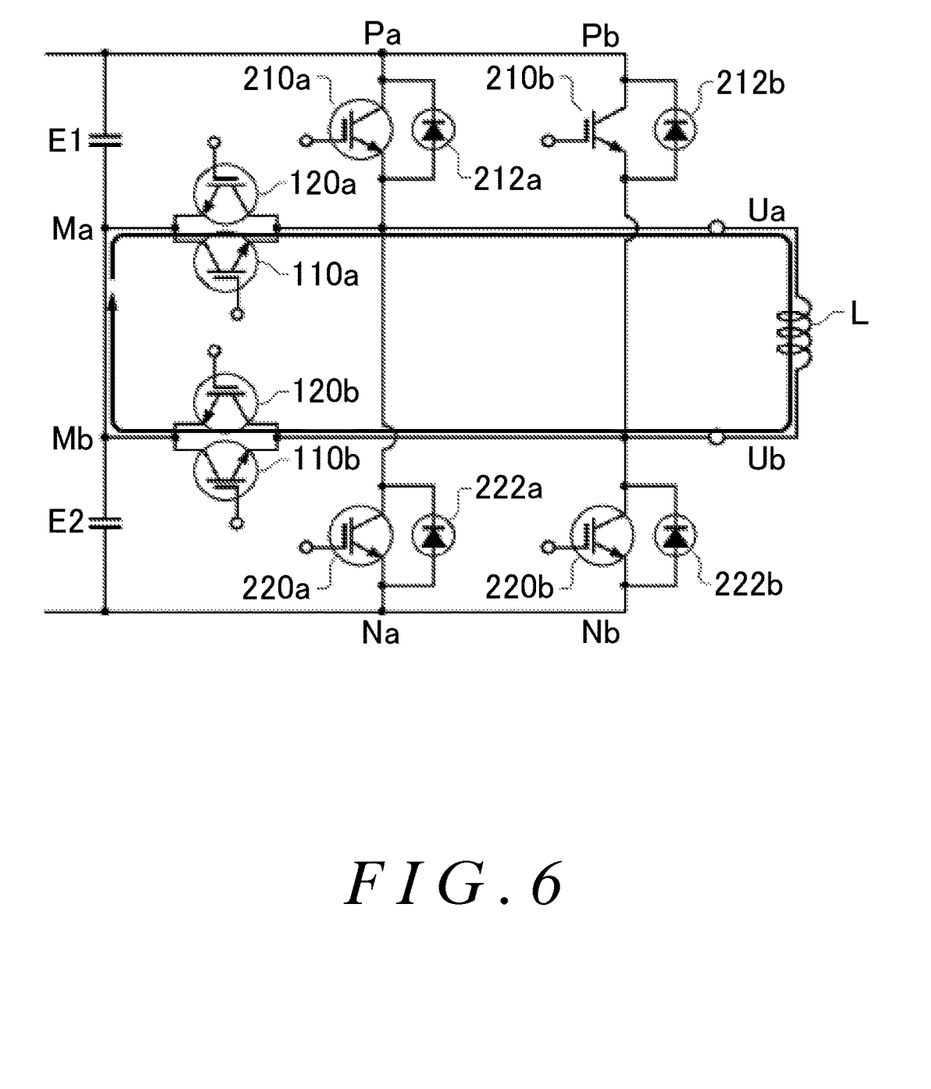
FIG. 6 shows a first exemplary operation of a 3-level circuit formed by the semiconductor apparatus 10 according to the present embodiment.

FIG. 6 shows a first exemplary operation of a 3-level circuit formed by the semiconductor apparatus 10 according to the present embodiment. FIG. 6 shows an example of the semiconductor apparatus 10 shown in FIG. 5 as a two-phase power control circuit. In FIG. 6, the components included in the first-phase semiconductor apparatus 10 are shown by a lower case "a" (e.g. the first device 110a, the second device 120a, and the like), and the components included in the second-phase semiconductor apparatus 10 are shown by a lower case "b" (e.g. the first device 110b, the second device 120b, and the like).

The terminal Ma and the terminal Mb, the terminal Na and the terminal Nb, and the terminal Pa and the terminal Pb are respectively electrically connected to each other. A power supply E1 is connected between the terminal Ma and the terminal Pa. In other words, the power supply E1 is connected between the terminal Mb and the terminal Pb. Furthermore, a power supply E2 is connected between the terminal Ma and the terminal Na. In other words, the power supply E2 is connected between the terminal Mb and the terminal Nb. The power supply E1 and the power supply E2 may be substantially the same power supply. Furthermore, a load L is connected between the terminal Ua and the terminal Ub. The power control circuit shown in FIG. 6 outputs a plurality of signal levels to the load L.

FIG. 6 shows an example in which the first device 110a and the second device 120b are turned ON, and all of the other switching devices are turned OFF. In this case, the power supplies E1 and E2 do not form a closed circuit with the load L, and therefore the voltage level supplied to the load L by the power control circuit is 0 [V].

Figure 7:
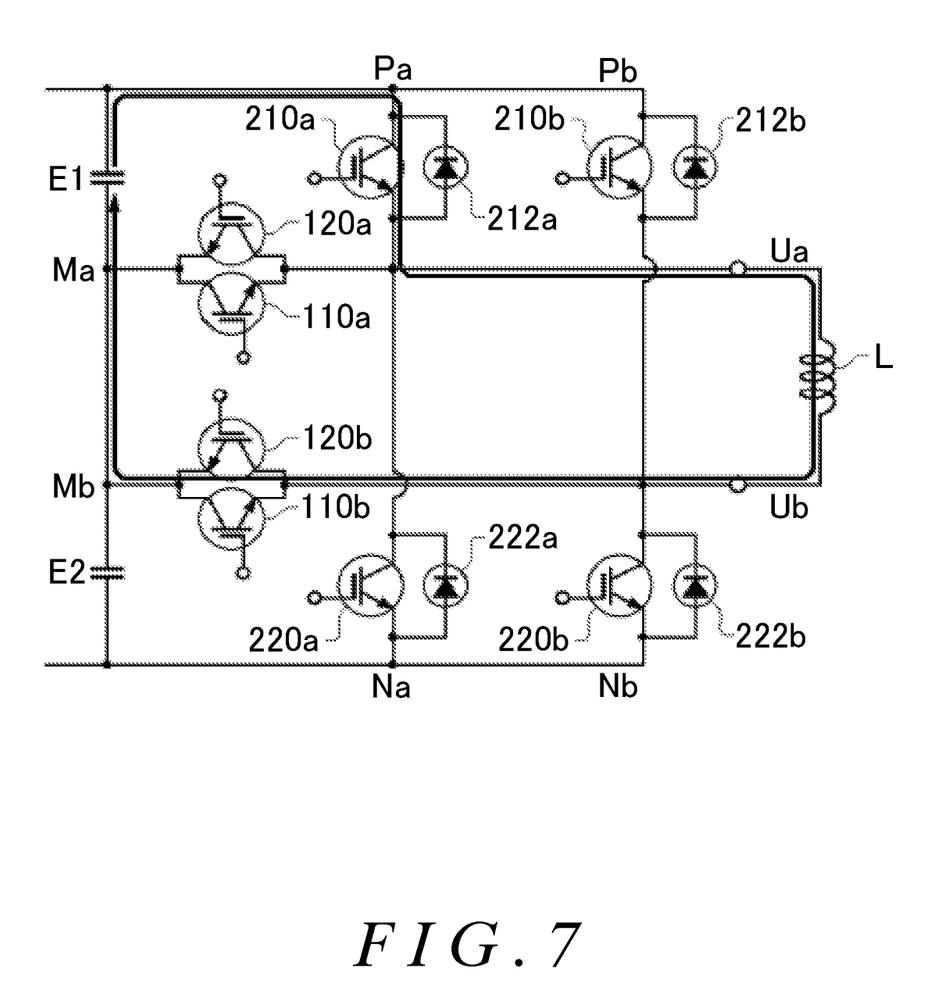
FIG. 7 shows a second exemplary operation of the 3-level circuit shown in FIG. 6.

FIG. 7 shows a second exemplary operation of the 3-level circuit shown in FIG. 6. FIG. 7 shows an example in which the second device 120b and the third device 210a are turned ON, and all of the other switching devices are turned OFF. In this case, the power supply E1 forms a closed circuit with the load L, and therefore the power control circuit can supply a predetermined constant voltage level to the load L. Here, the predetermined constant voltage level is +V [V].

Figure 8:
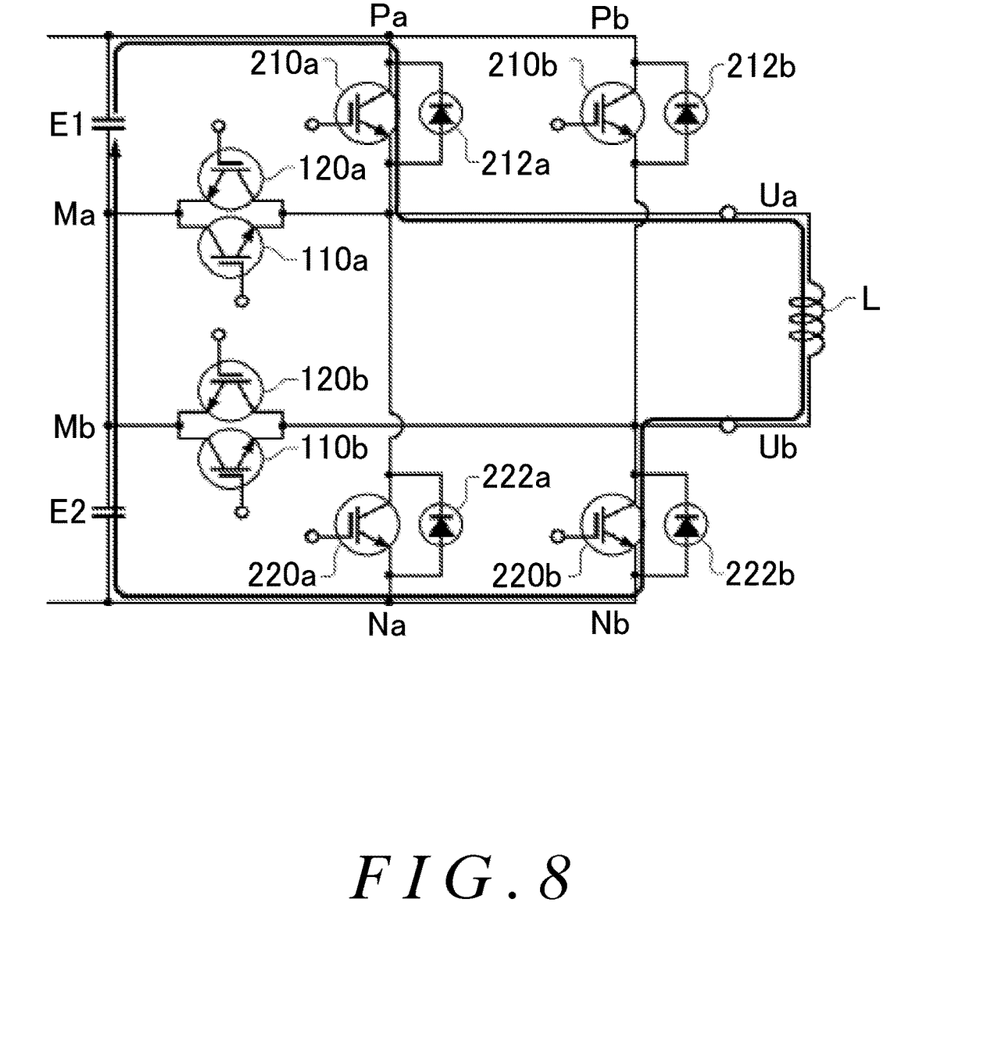
FIG. 8 shows a third exemplary operation of the 3-level circuit shown in FIG. 6.

FIG. 8 shows a third exemplary operation of the 3-level circuit shown in FIG. 6. FIG. 8 shows an example in which the third device 210a and the fourth device 220b are turned ON, and all of the other switching devices are turned OFF. In this case, the power supplies E1 and E2 form a closed circuit with the load L, and therefore the power control circuit can supply a predetermined constant voltage level to the load L. Here, as an example, when the power supplies E1 and E2 supply substantially the same voltage, the predetermined constant voltage level is +2V [V]. As described above, the power control circuit shown in FIG. 6 can supply three positive signal levels of 0 [V], +V [V], and +2V [V] to the load L.

Figure 9:
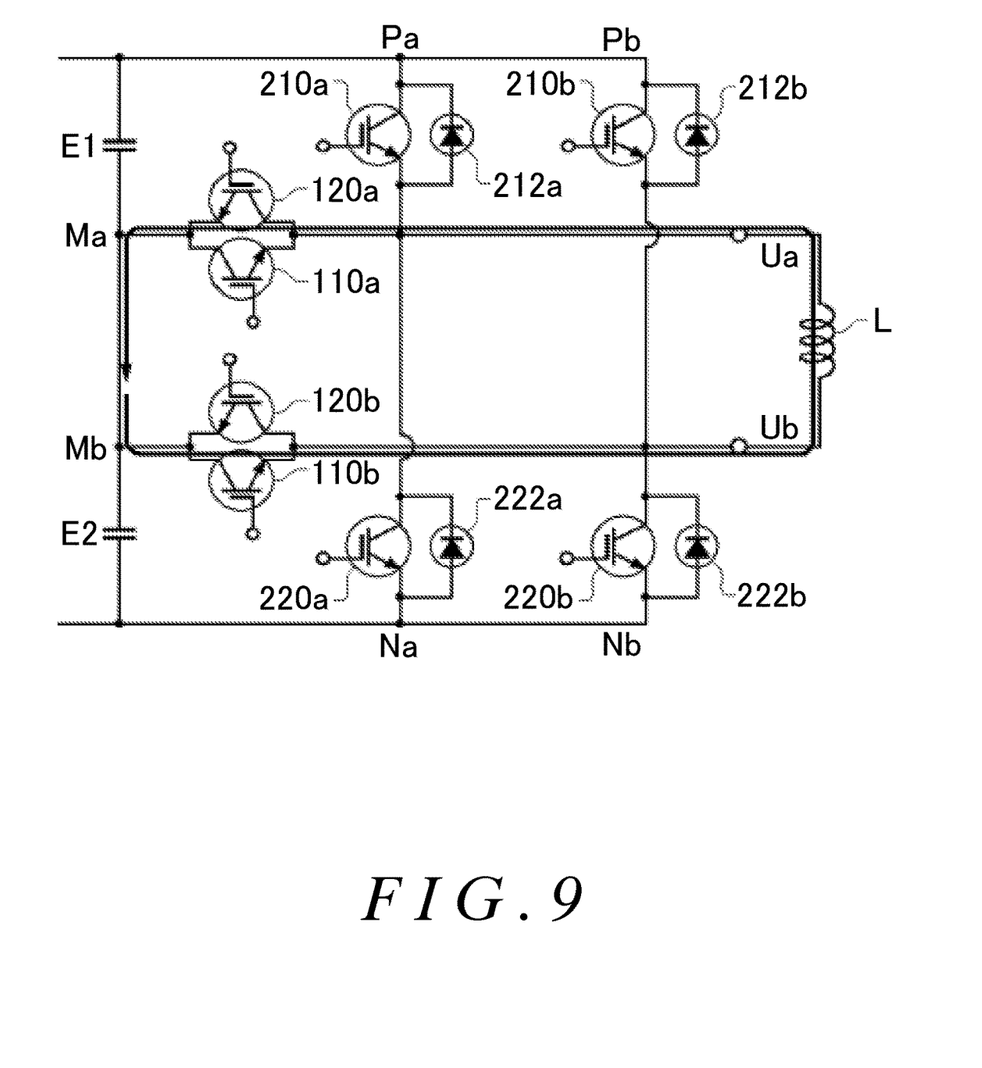
FIG. 9 shows a fourth exemplary operation of the 3-level circuit shown in FIG. 6.

FIG. 9 shows an exemplary fourth operation of the 3-level circuit shown in FIG. 6. FIG. 9 shows an example in which the first device 110b and the second device 120a are turned ON, and all of the other switching devices are turned OFF. In this case, the power supplies E1 and E2 do not form a closed circuit with the load L, and therefore the voltage level supplied to the load L by the power control circuit is 0 [V].

Figure 10:
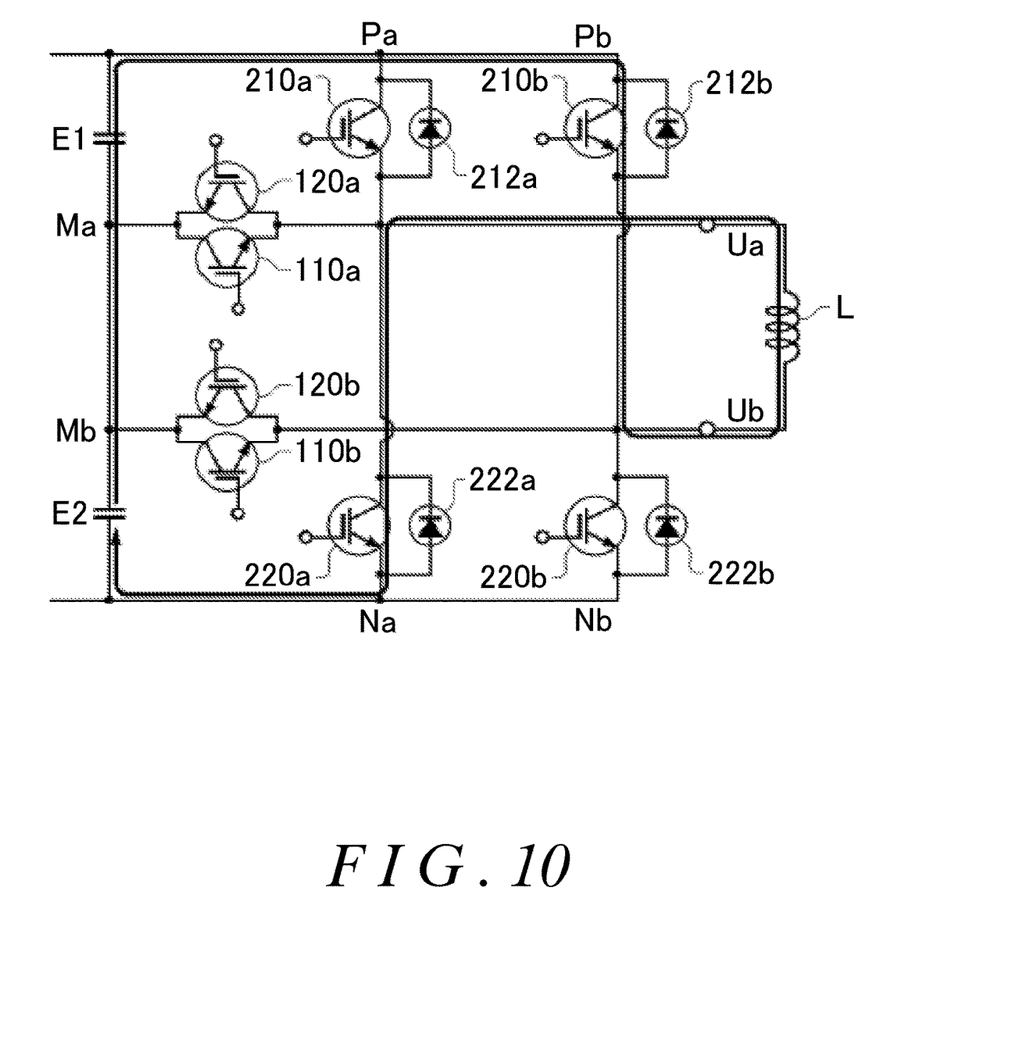
FIG. 10 shows a fifth exemplary operation of the 3-level circuit shown in FIG. 6.

FIG. 10 shows an exemplary fifth operation of the 3-level circuit shown in FIG. 6. FIG. 10 shows an example in which the third device 210b and the fourth device 220a are turned ON, and all of the other switching devices are turned OFF. In this case, the power supplies E1 and E2 form a closed circuit with the load L, and therefore the power control circuit can supply a predetermined constant voltage to the load L. In FIG. 10, the connection between the power supplies E1 and E2 and the load L is in the opposite direction from the connection between the power supplies E1 and E2 and the load L shown in FIG. 8, and therefore the predetermined constant voltage level is −2V [V].

Figure 11:
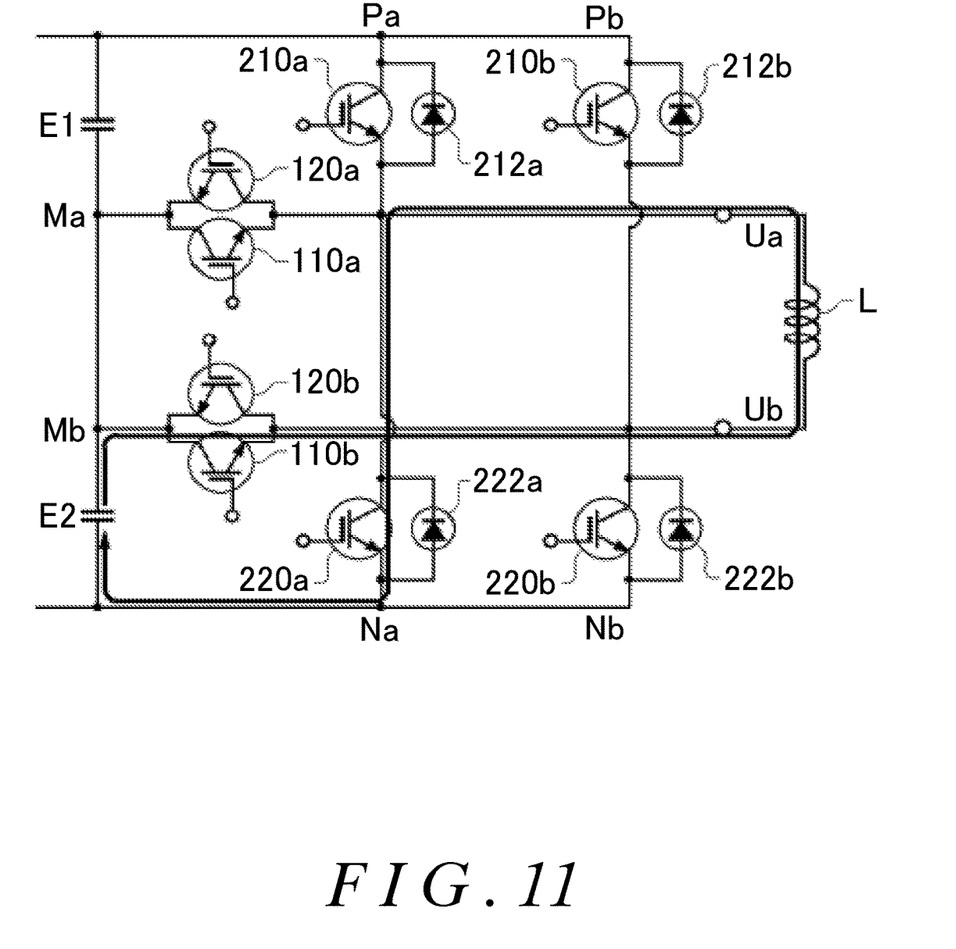
FIG. 11 shows a sixth exemplary operation of the 3-level circuit shown in FIG. 6.

FIG. 11 shows an exemplary sixth operation of the 3-level circuit shown in FIG. 6. FIG. 11 shows an example in which the first device 110b and the fourth device 220a are turned ON, and all of the other switching devices are turned OFF. In this case, the power supply E2 forms a closed circuit with the load L, and therefore the power control circuit can supply a predetermined constant voltage to the load L. In FIG. 11, the connection between the power supply E2 and the load L is in the opposite direction from the connection between the power supply E1 and the load L shown in FIG. 7, and therefore the predetermined constant voltage level is −V [V]. As described above, the power control circuit shown in FIG. 6 can supply three negative signal levels of 0 [V], −V [V], and −2V [V] to the load L.

As described above, the semiconductor apparatus 10 according to the present embodiment can form a power control circuit that outputs a plurality of signal levels. Furthermore, when a short circuit occurs between the terminals of the semiconductor apparatus 10 or the like and an overcurrent flows between the first device 110 and the second device 120 in the same semiconductor apparatus 10, for example, it is possible to reduce the inductances and the induced magnetic fields and to prevent damage or the like to the elements. Furthermore, when an overcurrent flows between the terminal P and the terminal M in the same semiconductor apparatus 10, it is possible to reduce the inductances and the induced magnetic fields and to prevent damage or the like to the elements. In the same manner, when an overcurrent flows between the terminal N and the terminal M in the same semiconductor apparatus 10, it is possible to reduce the inductances and the induced magnetic fields and to prevent damage or the like to the elements.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
a plurality of first devices of a first region;
one or more second devices of a second region; and
a connection conductor that electrically connects the first devices to the second device, wherein
the connection conductor includes current paths that are adjacent and have opposite directions in at least a portion thereof, and is connected in parallel to each of the plurality of first devices, and
the connection conductor includes:
a first current path with a direction away from the second device on a first device side:
a second current path that folds back from the first current path to have a direction toward the second device;
a third current path with a direction away from the first devices on a second device side; and a fourth current path that folds back from the third current path to have a direction toward the first devices.

2. The semiconductor apparatus according to claim 1, wherein
the connection conductor causes current to flow from the first devices to the second device, and causes current to flow in a direction from the second device toward the first devices in at least a portion thereof.

3. The semiconductor apparatus according to claim 1, wherein
the connection conductor causes current to flow from the second device to the first devices, and causes current to flow in a direction from the first devices to the second device in at least a portion thereof.

4. The semiconductor apparatus according to claim 1, wherein
the connection conductor has a parallel board structure formed by the current paths that are adjacent to each other.

5. The semiconductor apparatus according to claim 1, comprising:
a plurality of the second devices in the second region, wherein
the connection conductor is connected in parallel with each of the plurality of second devices.

6. The semiconductor apparatus according to claim 1, wherein the connection conductor includes:
a main conducting portion having the first current path, the second current path, the third current path, and the fourth current path;
a plurality of first connecting portions that connect the first current path respectively to the plurality of first devices; and
a plurality of second connecting portions that connect the third current path respectively to the plurality of second devices.

7. The semiconductor apparatus according to claim 1, comprising:
a plurality of the first devices in the first region; and
a plurality of the second devices in the second region, wherein
the plurality of first devices and the plurality of second devices are arranged in a direction from the first region toward the second region.

8. The semiconductor apparatus according to claim 1, further comprising:
a substrate, wherein
the first region and the second region are provided in the substrate.

9. The semiconductor apparatus according to claim 8, wherein
the substrate is an insulated substrate.

10. The semiconductor apparatus according to claim 1, wherein
the first devices and the second device are insulated gate bipolar transistors or power MOSFETs.

11. The semiconductor apparatus according to claim 1, wherein
the first current path is not directly electrically connected to the third current path and is connected to the third current path via the second current path and the fourth current path.

12. The semiconductor apparatus according to claim 1, wherein
the connection conductor further includes a terminal portion that is connected to outside and transfers current to and from the outside.

13. The semiconductor apparatus according to claim 12, wherein
an emitter terminal of one of the first devices is connected to a collector terminal of the second device via the connection conductor, and
the emitter terminal of the first device and the collector terminal of the second device are connected to an external load via the terminal portion.

14. The semiconductor apparatus according to claim 12, wherein
the terminal portion functions as an input terminal or an output terminal to transfer current between the outside of the semiconductor apparatus and the first device or between the outside of the semiconductor apparatus and the second device.

* * * * *